(12) United States Patent
Gris

(10) Patent No.: US 6,376,883 B1
(45) Date of Patent: Apr. 23, 2002

(54) BIPOLAR TRANSISTOR AND CAPACITOR

(75) Inventor: Yvon Gris, Tullins (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 09/724,010

(22) Filed: Nov. 28, 2000

Related U.S. Application Data

(62) Division of application No. 08/994,280, filed on Dec. 19, 1997, now Pat. No. 6,187,646.

(30) Foreign Application Priority Data

Dec. 20, 1996 (FR) .............................................. 96 16065

(51) Int. Cl.[7] .............................................. H01L 29/76
(52) U.S. Cl. ...................... 257/378; 257/552; 257/511; 257/516; 257/528; 257/532; 257/370; 438/202
(58) Field of Search ................................. 257/514, 515, 257/552, 378, 511, 516, 528, 532, 273, 370; 438/202

(56) References Cited

U.S. PATENT DOCUMENTS

| | | | | |
|---|---|---|---|---|
| 4,345,366 A | * | 8/1982 | Brower ........................ 29/571 |
| 4,734,382 A | | 3/1988 | Krishna ...................... 438/234 |
| 4,805,071 A | | 2/1989 | Hutter et al. ................ 361/313 |
| 4,957,874 A | * | 9/1990 | Soejima ........................ 437/31 |
| 5,045,484 A | * | 9/1991 | Yamada et al. ................ 437/31 |
| 5,108,941 A | * | 4/1992 | Paterson et al. .............. 437/47 |
| 5,286,667 A | | 2/1994 | Lin et al. ...................... 437/52 |
| 5,321,650 A | * | 6/1994 | Kikuchi et al. ............. 365/177 |
| 5,395,782 A | * | 3/1995 | Ohkoda et al. ................ 437/47 |
| 5,457,062 A | | 10/1995 | Keller et al. ................. 438/238 |
| 5,489,547 A | | 2/1996 | Erdeljac et al. ............. 438/238 |
| 5,633,181 A | * | 5/1997 | Hayashi ...................... 438/234 |
| 5,665,615 A | * | 9/1997 | Anmo ........................ 438/202 |
| 5,766,999 A | * | 6/1998 | Sato ............................ 438/309 |
| 5,773,349 A | * | 6/1998 | Ham ............................ 438/348 |
| 5,943,564 A | * | 8/1999 | Chen et al. .................. 438/202 |
| 6,004,841 A | * | 12/1999 | Chang et al. ................ 438/238 |
| 6,207,484 B1 | * | 3/2001 | Kim et al. ................... 438/209 |

FOREIGN PATENT DOCUMENTS

| | | | | |
|---|---|---|---|---|
| EP | 0 581 475 | | 10/1994 | .......... H01L/27/06 |
| EP | 0 746 1996 | | 12/1996 | .......... H01L/27/06 |
| JP | 06232338 | * | 8/1994 | ................. 257/380 |

OTHER PUBLICATIONS

French Preliminary Search Report from French Patent Application 96 16065, filed Dec. 20, 1996.

Patent Abstracts of Japan, vol. 95, No. 1, Feb. 28, 1995 & JP–A–06 291262 (Sony Corp.).

Scharf, B.: "BICMOS Process Design For Mixed–Signal Applications" May 10, 1992, Proceedings Of The International Symposium on Circuits and Systems, San Diego, May 10–13, 1992, vol. 6 of 6, pp. 2683–2686, Institute of Electrical and Electronics Engineers.

* cited by examiner

*Primary Examiner*—Eddie Lee
*Assistant Examiner*—Eugene Lee
(74) *Attorney, Agent, or Firm*—Wolf, Greenfield & Sacks, P.C.; James H. Morris

(57) ABSTRACT

The present invention relates to a method of manufacturing a capacitor in a BICMOS integrated circuit manufacturing technology, including the steps of depositing, on a thick oxide region, a polysilicon layer corresponding to a MOS transistor gate electrode; successively depositing a base polysilicon layer and a silicon oxide layer; forming an opening in these last two layers; performing a thermal anneal in an oxidizing atmosphere; depositing a silicon nitride layer and a spacer polysilicon layer; depositing an emitter polysilicon layer; and making a contact with the base polysilicon layer and a contact with the emitter polysilicon layer.

15 Claims, 8 Drawing Sheets

BIPOLAR TRANSISTOR AND CAPACITOR

This application is a division of application Ser. No. 08/994,280, filed Dec. 19, 1997, entitled METHOD OF MANUFACTURING A CAPACITOR AS PART OF AN INTEGRATED SEMICONDUCTOR CIRCUIT, and now U.S. Pat. No. 6,187,646.

BACKGROUND OF THE INVENTION

Field of the Invention

The present invention relates to a line of manufacturing of integrated circuits containing, in particular bipolar and complementary MOS (CMOS) components. This type of line is usually called a BICMOS line.

SUMMARY OF THE INVENTION

An object of the present invention is to provide a BICMOS line wherein the dimensions of an element patterned on a mask can be lower than 0.4 μm, for example, 0.2 to 0.35 μm.

A more specific object of the present invention is to provide such a line wherein capacitors of high value are also formed.

To achieve these and other objects, the present invention provides a method of manufacturing of a capacitor in a BICMOS integrated circuit manufacturing technology, including the following steps:

depositing, on a thick oxide region, a polysilicon layer corresponding to a MOS transistor gate electrode, successively depositing a base polysilicon layer and a silicon oxide layer, forming an opening in these last two layers, performing a thermal anneal in an oxidizing atmosphere, to form an oxide layer, depositing a silicon nitride layer and a spacer polysilicon layer, the width of the opening being small enough for the spacer polysilicon to completely fill up the opening after etching, depositing an emitter polysilicon layer, and making a contact with the base polysilicon layer and a contact with the emitter polysilicon layer.

According to an embodiment of the present invention, the thermal oxide layer has a thickness on the order of 10 nm.

According to an embodiment of the present invention, the silicon nitride layer has a thickness on the order of 30 nm.

According to an embodiment of the present invention, the gate and base polysilicon layers are P-type doped and the spacer and emitter polysilicon layers are N-type doped.

The foregoing objects, characteristics and advantages of the present invention will be discussed in detail in the following non-limiting description of specific embodiments, in connection with the accompanying drawings.

DETAILED DESCRIPTION

Figure 1:
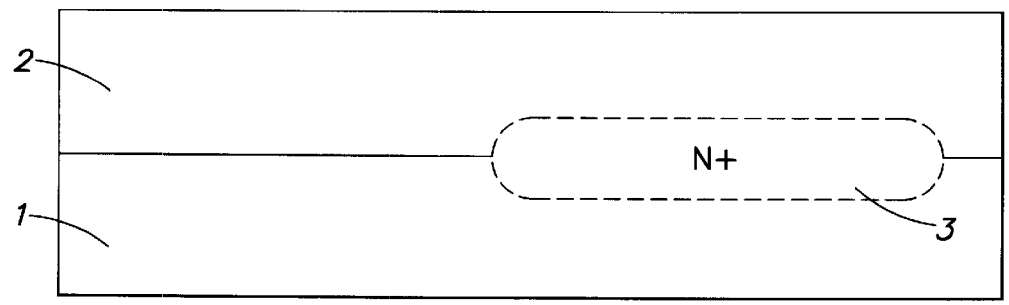
FIGS. 1 to 11 are simplified cross-sectional views illustrating successive steps of manufacturing of an embodiment of an N-channel MOS transistor, of a P-channel MOS transistor, and of an NPN-type bipolar transistor.

As usual in the field of the representation of semiconductor components, the several cross-sectional views are not drawn to scale. The lateral and crosswise dimensions of the several layers and regions are arbitrarily expanded or reduced to facilitate the drawing.

Generally in the following description, the left side of FIGS. 1 to 11 in which a CMOS component is formed will be designated as the MOS side and the right side of the drawings in which an NPN-type bipolar transistor is formed will be designated as the bipolar side. In the following, the manufacturing of an N-channel MOS transistor, of a P-channel MOS transistor, and of an NPN-type bipolar transistor will be described. Of course, in a practical implementation, many identical components, as well as possibly other types of primary components, will be formed simultaneously.

According to an aspect of the present invention, the initial steps correspond to known steps of fabrication of CMOS integrated circuits of very small dimensions (minimum dimension, or gate dimension, lower than 0.35 μm).

As shown in FIG. 1, a P-type substrate 1 is used to start with, and an N-type epitaxial layer 2 is formed thereon. This epitaxial layer is relatively thin, for example of a thickness of about 1 to 1.2 μm.

Before growth of the epitaxial layer, buried layers of appropriate types are provided, if desired, in the areas where N or P wells of CMOS transistors are to be formed and an $N^+$-type buried layer 3 is formed on the bipolar side.

Figure 2:
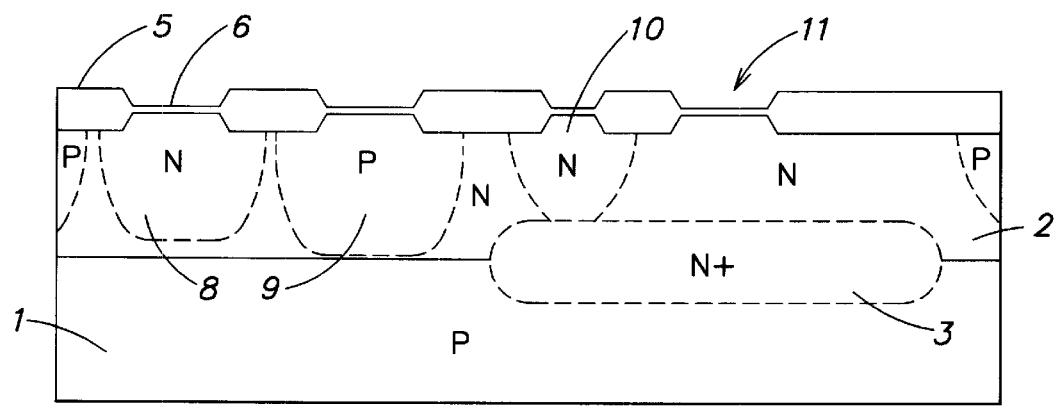

As shown in FIG. 2, on the MOS side, the MOS transistor regions are delimited by openings in a thick oxide layer 5 formed by any known technique. N-type wells 8 and P-type wells 9 are conventionally implanted through the thick oxide or a thin oxide region 6 formed in the openings. These wells are for example formed by a succession of three implantations, one of which reaches through thick oxide 5 in unmasked regions. These N and P wells are respectively meant for P-channel MOS transistors and N-channel MOS transistors. The surface doping level (some $10^{16}$ at./cm$^3$) determines the threshold voltage of the transistors. In the general case, the P wells (associated with a $P^+$ buried layer) are in electrical contact with the P substrate. It could be, however, provided to form some at least of the P wells on an N-type buried layer. The N wells are completely isolated since they emerge in substrate P and they are laterally isolated by P regions formed like the P wells.

Simultaneously, on the bipolar side, a region in which a collector contact recovery drive-in or collector well 10 joining buried layer 3 will be formed is defined in thick oxide 5. This collector well is formed by at least some of the implantations made to form N-type well 8, or by a specific $N^+$-type implantation. This collector well can also be formed subsequently at the same time as the sources and drains of the N-channel MOS transistors. Also, an area 11 where the base and emitter of an NPN-type bipolar transistor will be formed is defined in the thick oxide. During the several implantations of N and P wells, this area 11 is masked.

Figure 3:
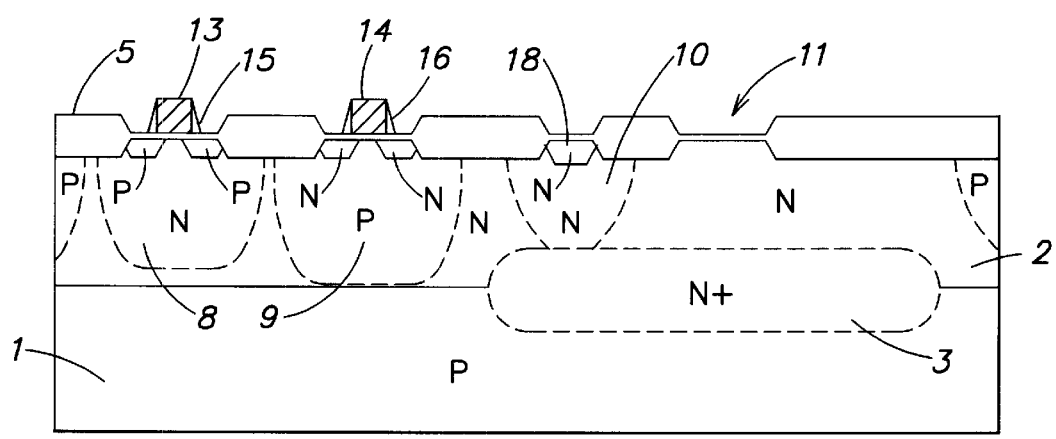

As shown in FIG. 3, on the MOS side, isolated gates 13 and 14 of the MOS transistors are conventionally formed; first implantations (LDD) are made; spacers 15 and 16 are formed; and drain and source implantations are made. In well 8, the implantations are of type N and, in well 9, the implantations are of type P. While the source and drain implantation of the N-channel transistors in the P wells are being made, a heavily-doped N-type diffusion 18 is performed at the surface of collector well 10 to improve the subsequent linkup.

A fast thermal anneal is then performed (1025° C.).

After this step, at the end of which most of the MOS transistors have been made (except for the possible linkup silicidations and the metallizations), the implementation of the NPN-type bipolar transistor is started.

Figure 4:
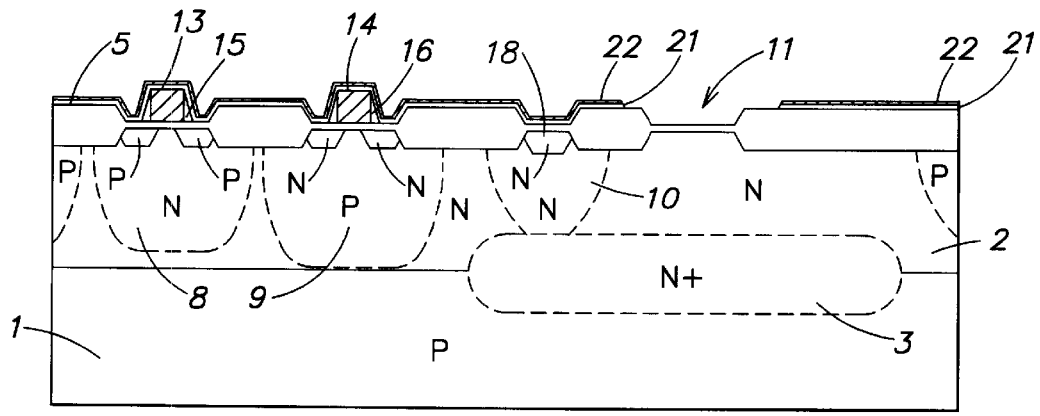

At the step illustrated in FIG. 4, a double protection layer including a silicon oxide layer 21 having, for example, a thickness of about 20 nm followed by a silicon nitride layer 22 having, for example, a thickness of about 30 nm is deposited on the entire structure, by chemical vapor deposition. This layer 21–22 is opened in the area 11 where it is desired to form the emitter-base region of a bipolar transistor. It should be noted that this opening is not critical since it stops on thick oxide regions.

Figure 5:
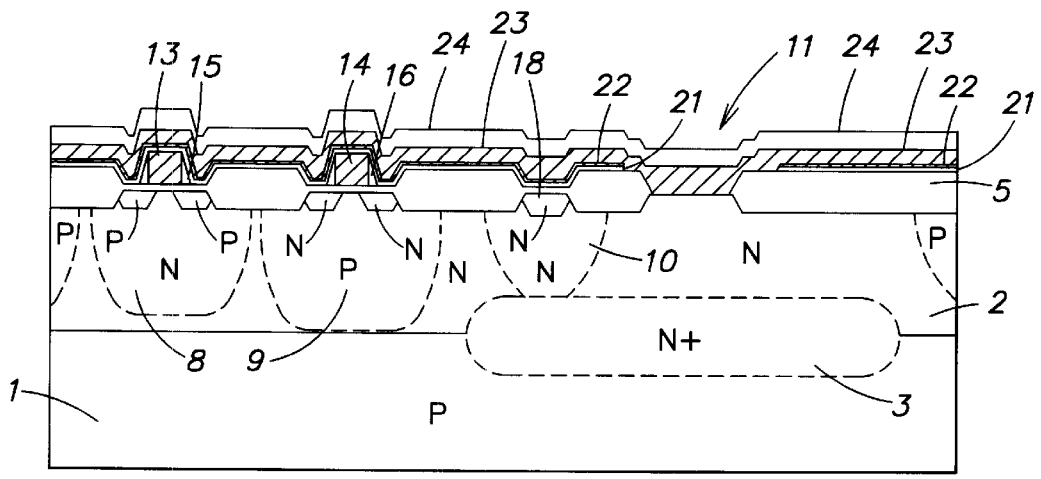

At the step illustrated in FIG. 5, a silicon layer 23 having, for example, a thickness of about 200 nm followed by an encapsulation oxide layer 24 having, for example, a thickness of about 300 nm is deposited over the entire structure.

Silicon layer 23 must be P-type doped since it will be used, as will be seen hereafter, as a doping source for the extrinsic base of the NPN transistor and will be called base polysilicon. Although called polysilicon, it can also be any type of deposited silicon layer, for example amorphous silicon. Preferably, according to an aspect of the present invention, a layer 23 of polysilicon or undoped amorphous silicon is first deposited, after which a P-type doping is implanted in this layer. Preferably, boron is implanted in the form of $BF_2$ at very high dose ($10^{15}$ to $10^{16}$ at./cm$^2$) and low energy so that the implanted boron concentrates in the upper part of the layer, avoiding boron implantation in the underlying silicon substrate in region 11.

Figure 6:
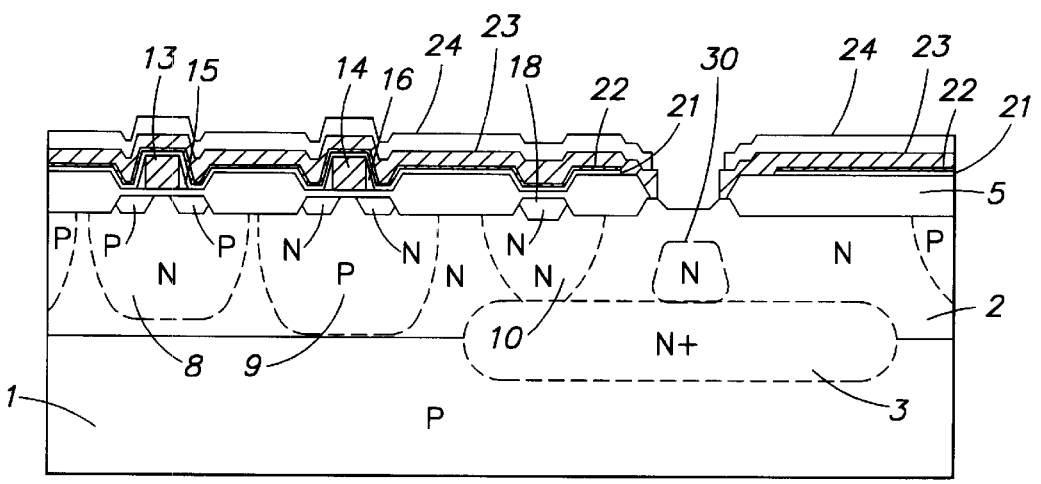

At the step illustrated in FIG. 6, an opening is provided in layers 24 and 23 in the central part of region 11. This opening has, for example, a width included between 0.4 and 0.8 µm and penetrates into the single crystal silicon by less than 50 nm. An N-type doping is then implanted to define collector 30 of the NPN transistor. This collector is thus self-aligned on the opening. The N implantation is performed at medium dose and high energy (for example, $10^{12}$ to $10^{14}$ at./cm$^2$ under 500 keV). An effective collector region of limited lateral extension, substantially equal to that of the intrinsic base formed afterwards is thus obtained. This contributes to obtaining an NPN transistor having low stray capacitance between collector and extrinsic base. The implantation is optimized (for example, by successive implantations) so that the collector profile provides the best possible compromise between, on the one hand, the collector resistance and the time of transit through this collector and, on the other hand, obtaining sufficiently high emitter-collector (typically 4 volts) and base-collector breakdown voltages and of a low base-collector capacitance. It should also be noted that this collector implantation enables to previously choose an epitaxial layer 2 having a doping and thickness suitable to optimize the CMOS transistors and then independently optimize the characteristics of the NPN transistors. Especially, this epitaxial layer can be thicker than if it had to be directly used as a collector layer of the NPN transistor.

Figure 7:
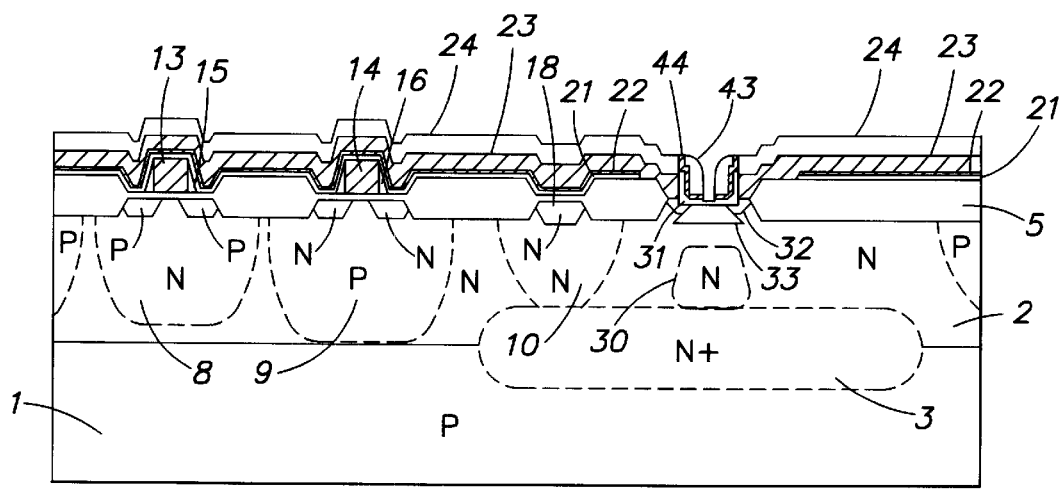

As shown in FIG. 7, after removal of the masking resist, a thermal oxidation is performed, during which a thin thermal oxide layer 31 of a thickness on the order of 5 to 10 nm forms and during which the boron contained in polysilicon layer 23 starts diffusing into the underlying epitaxial layer to form extrinsic base region 32 having, for example, a junction depth of about 100 mn. This diffusion is then complemented with the final annealing of the bipolar structure. A P-type implant is then performed through oxide 31 to form an intrinsic base region 33 at the center of the opening in layers 23 and 24. This intrinsic base is preferably implanted with low energy boron (for example, $10^{13}$ at./cm$^2$ under 5 keV). The contact with polysilicon 23 results from the lateral diffusion of the boron of the polysilicon.

A uniform deposition of a thin silicon nitride layer (30 nm) coated with a polysilicon layer (100 nm) is then performed. The polysilicon layer is then etched anisotropically so that there only remains spacers 43 on the sides of the opening made in layers 23 and 24. A uniform etching of the silicon nitride is then performed, so that this silicon nitride remains in place only in the regions 44 where it is protected from the etching (chemical or plasma etching) by polysilicon spacers 43. Nitride 44 and spacers 43 thus altogether define a smaller opening than the opening initially formed in layers 23 and 24 for the definition of the intrinsic base. This smaller opening is the emitter opening. If the spacers have a width of about 150 nm each, this small opening has a width of about 0.5 µm.

Figure 8:
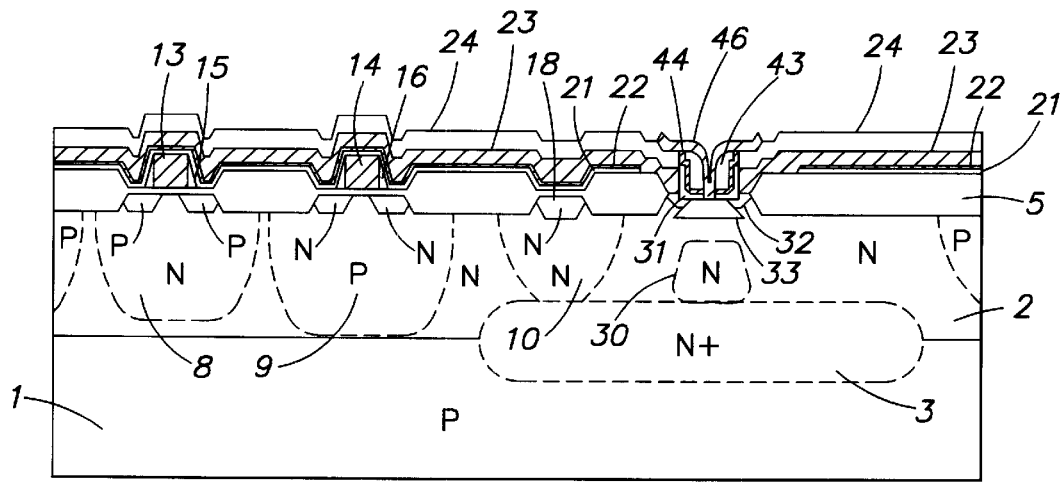

At the step illustrated in FIG. 8, thin oxide layer 31 at the bottom of the opening, which has been used as a protective layer during the emitter implantation (boron) and as an etching stop of the silicon nitride layer, is thoroughly cleaned, for example in a bath of diluted hydrofluoric acid. A heavily-doped N-type polysilicon layer is deposited, and then etched to leave in place a region 46. Regions of doped polysilicon layer 46 can be maintained in place at chosen locations to form, for example, capacitors between regions of this polysilicon 46 and regions of base polysilicon 23.

Figure 9:
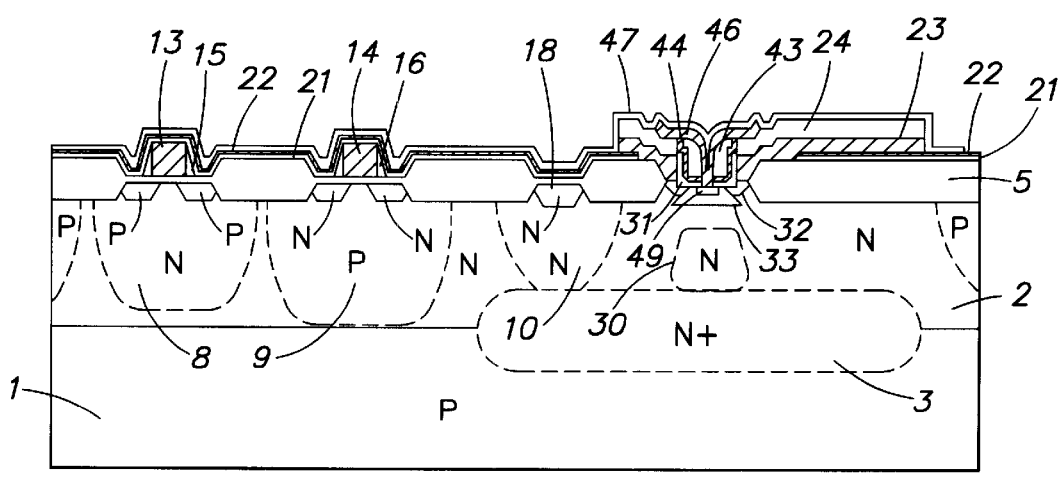

At the step illustrated in FIG. 9, oxide layer 24 and base polysilicon layer 23 are removed outside the emitter-base region of the bipolar transistor and other possible regions including devices using portions of base polysilicon layer 23 (resistors, capacitors . . . ). Then, an encapsulation silicon oxide layer 47 is deposited.

After this, a penetration annealing of the doping contained in polysilicon layer 46 at the center of the base region of the transistor to form its N-type emitter 49 is performed. The annealings associated with the bipolar transistor ensure an electric reactivation of the dopings and lead to junction depths of about 60 nm. The annealings are of the fast thermal anneal type and/or furnace anneal. The thermal processing (30 s, 1000° C.) is lighter than for the MOS transistors which are thus not affected.

Figure 10:
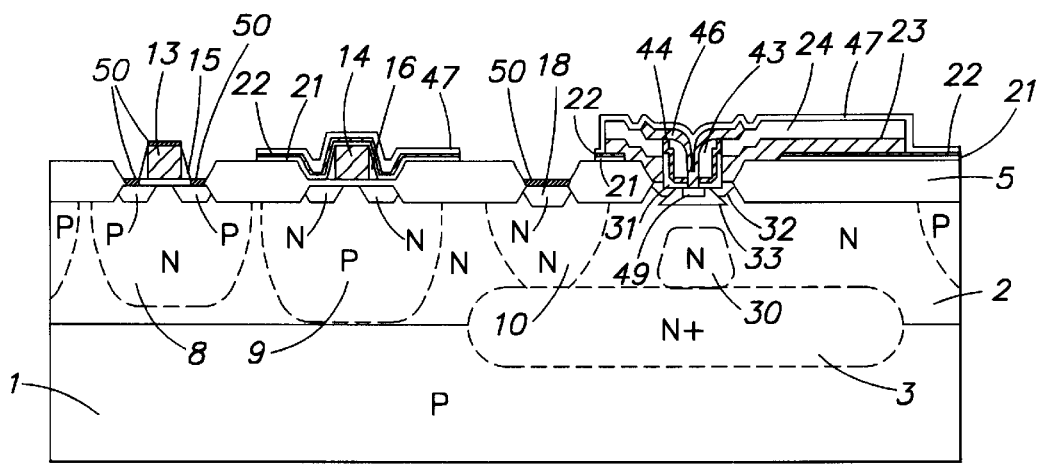

At the step illustrated in FIG. 10, silicon oxide encapsulation layer 47, silicon nitride layer 22, and protection silicon oxide 21 are then removed above the active and/or polysilicon areas which are desired to be silicided, for example the P-channel MOS transistor and the collector well of the bipolar transistor. A metal silicide 50 is formed selectively above the exposed polysilicon and monosilicon regions.

Figure 11:
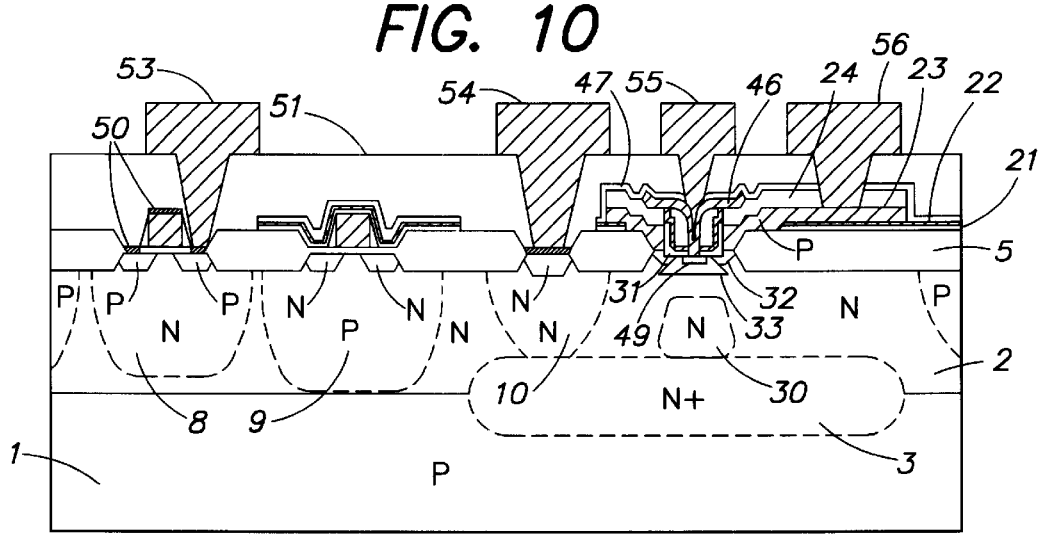

At the step illustrated in FIG. 11, a planarization isolating layer 51 is deposited by any known method, for example, by deposition of a boron and phosphorus doped glass (BPSG) layer and annealed, after which this layer and possible underlying layers are opened at the locations where contacts are desired to be made. Only some contacts have been shown since, as is well known, the contacts are not necessarily taken directly above the effective areas but possibly on crosswise extensions of conductive regions extending from these effective areas. Thus, in FIG. 11, only one drain contact 53 of a P-channel MOS transistor, one collector contact 54, one emitter contact 55 and one base contact 56 of the bipolar transistor have been shown.

Figure 12:
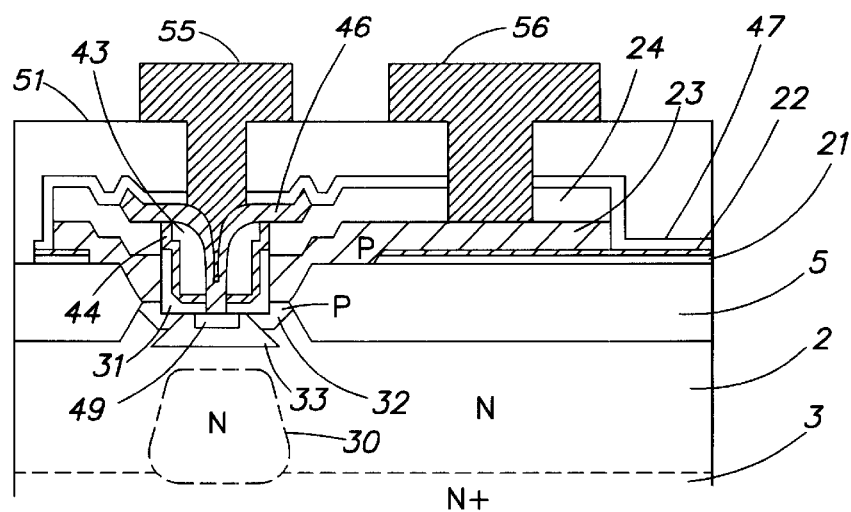
FIG. 12 is an enlarged view of an NPN-type bipolar transistor obtained by the method illustrated in FIGS. 1 to 11.

FIG. 12 corresponds to the bipolar side of FIG. 11 and shows the emitter-base region of the bipolar transistor at greater scale.

In a specific embodiment, and to give an example of orders of magnitude, the implementation of a structure with the following numerical data (where e designates a thickness, and Cs a superficial concentration or a mean concentration for a homogeneous layer) may be chosen:

substrate 1: $Cs=10^{15}$ at./cm$^3$,
epi layer 2: $Cs=10^{16}$ at./cm$^3$, e=0.8 to 1.4 $\mu$m,
buried layer 3: $Cs=10^{20}$ at./cm$^3$,
oxide 5: e=0.5 $\mu$m,
N or P sources and drains: $Cs=10^{20}$ at./cm$^3$, e=0.15 $\mu$m.

The above-described method of manufacturing, while entirely compatible with existing lines of manufacturing of high definition CMOS transistors, enables implementation of a bipolar transistor, the collector, intrinsic base, and emitter regions of which are self-aligned.

This bipolar transistor has many advantages. Its performance does not suffer from the presence of CMOS transistors. It can, in particular, be used at radiofrequencies (cut-off frequency higher than 40 GHz). The very high transconductance and the low noise of the bipolar transistor make it suitable for analog applications. In particular, the base contact (in P$^+$ polysilicon) enables an advantageous and large reduction of the base resistance, which results in an advantageous improvement in noise factor RF. Thus, the bipolar transistor can be used instead of some gallium arsenide transistors with a lower cost and the possibility of associating it on a same chip with a high performance CMOS circuit.

The present invention aims at implementing, in an integrated BICMOS circuit manufactured according to the above-described technology, a capacitor of high value without increasing the number of manufacturing steps.

The manufacturing of such a high value capacitor will be described in relation with FIGS. 13 to 19 which respectively correspond to FIGS. 3 to 9.

Figure 13:
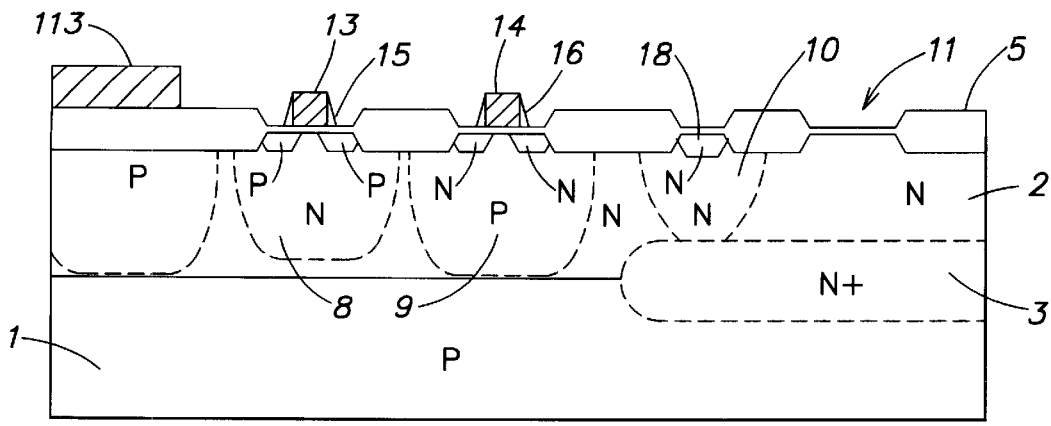
FIGS. 13 to 19 show steps of manufacturing of a capacitor according to the present invention.

As shown in FIG. 13, at the step of FIG. 3, in addition to gates 13 and 14 of the MOS transistors, a P-type doped polysilicon layer 113 is formed (like gate 13 of the P-channel MOS transistors, that is, conventionally by the same implantation as the sources and drains of these transistors) above a thick oxide region 5. Of course, spacer 115 corresponding to spacers 15 will form on the edges of this layer.

Figure 14:
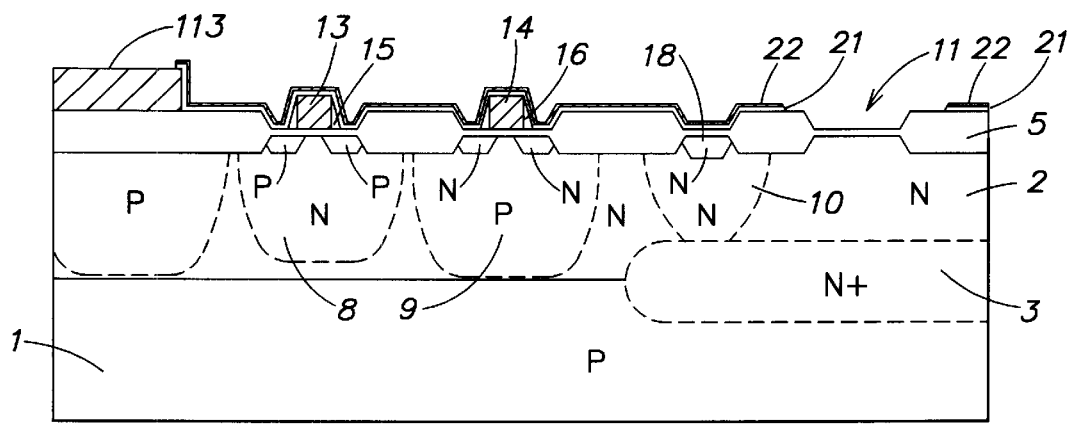

As shown in FIG. 14, at the step of FIG. 4, a double layer of silicon oxide and silicon nitride 21–22 which is cleared above an upper part of layer 113 concurrently to the clearing of emitter-base opening 11 is deposited.

Figure 15:
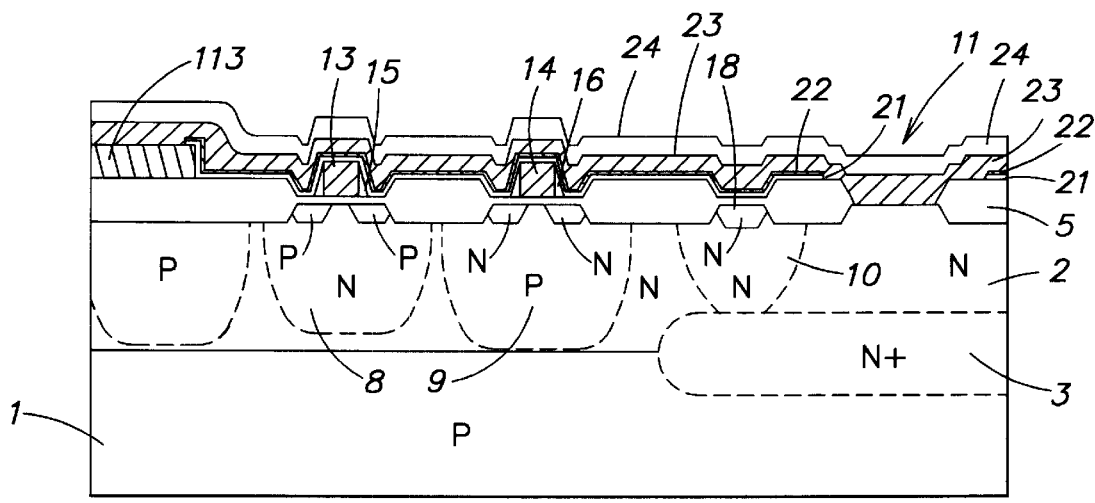

At the step of FIG. 15, the structure is covered with base polysilicon layer 23 and protection oxide layer 24.

Figure 16:
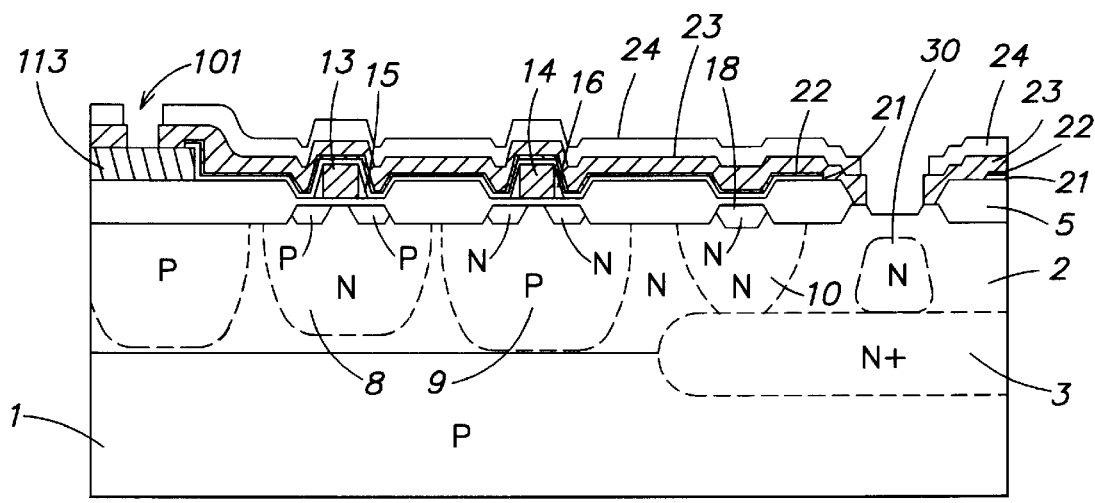

At the step of FIG. 16, layers 23 and 24 are etched above polysilicon layer 113 to form an opening 101 concurrently to the forming of the emitter-base opening.

Figure 17:
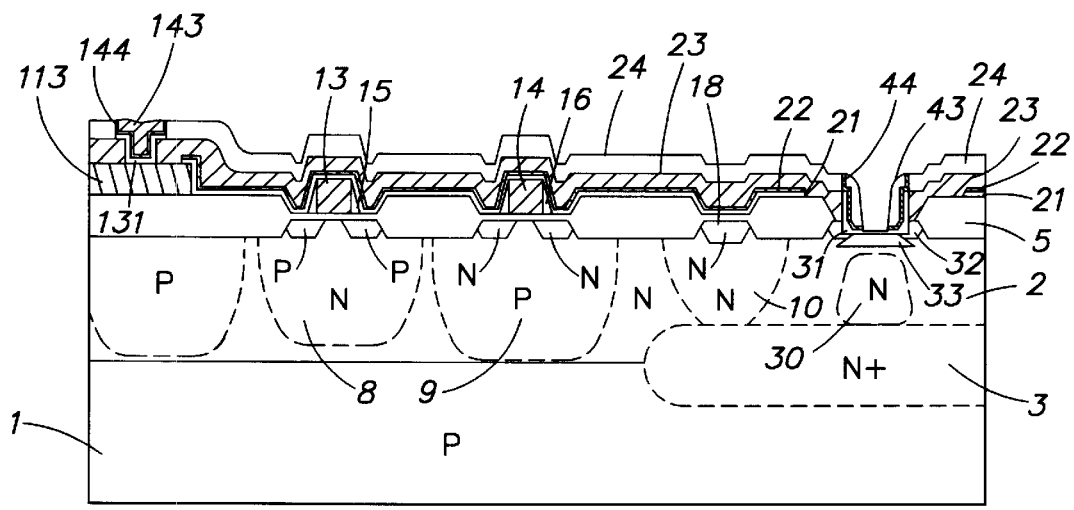

As shown in FIG. 17, at the step of FIG. 7, a thermal oxidation and a silicon nitride deposition are performed in order to form, at the bottom and on the edges of opening 101, a coating including a thermal oxide layer 131 corresponding to layer 31 and a silicon nitride layer 144 corresponding to silicon nitride region 44. Then, the deposition of a polysilicon layer for forming spacers 43 after etching is performed.

The width of opening 101 is chosen so that, after etching of the polysilicon, this opening remains completely filled up with polysilicon 143. This means that, if the structure had been provided so that the spacers have a width of about 150 to 200 nm, opening 101 will have a maximum width of about 350 nm. Further, spacers 43 have been previously described to be formed in undoped polysilicon. Here, it will be chosen to implement these spacers in N$^+$-type heavily-doped polysilicon. This does not alter the operation of the structure on the emitter-base side since the level of N-type doping of region 43 was, in practice, indifferent.

Figure 18:
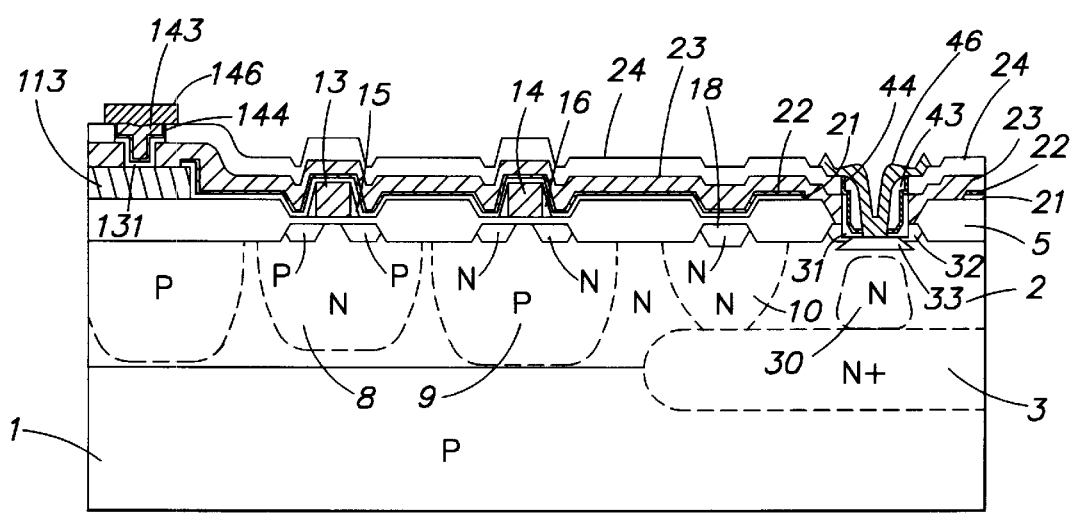
Figure 19:
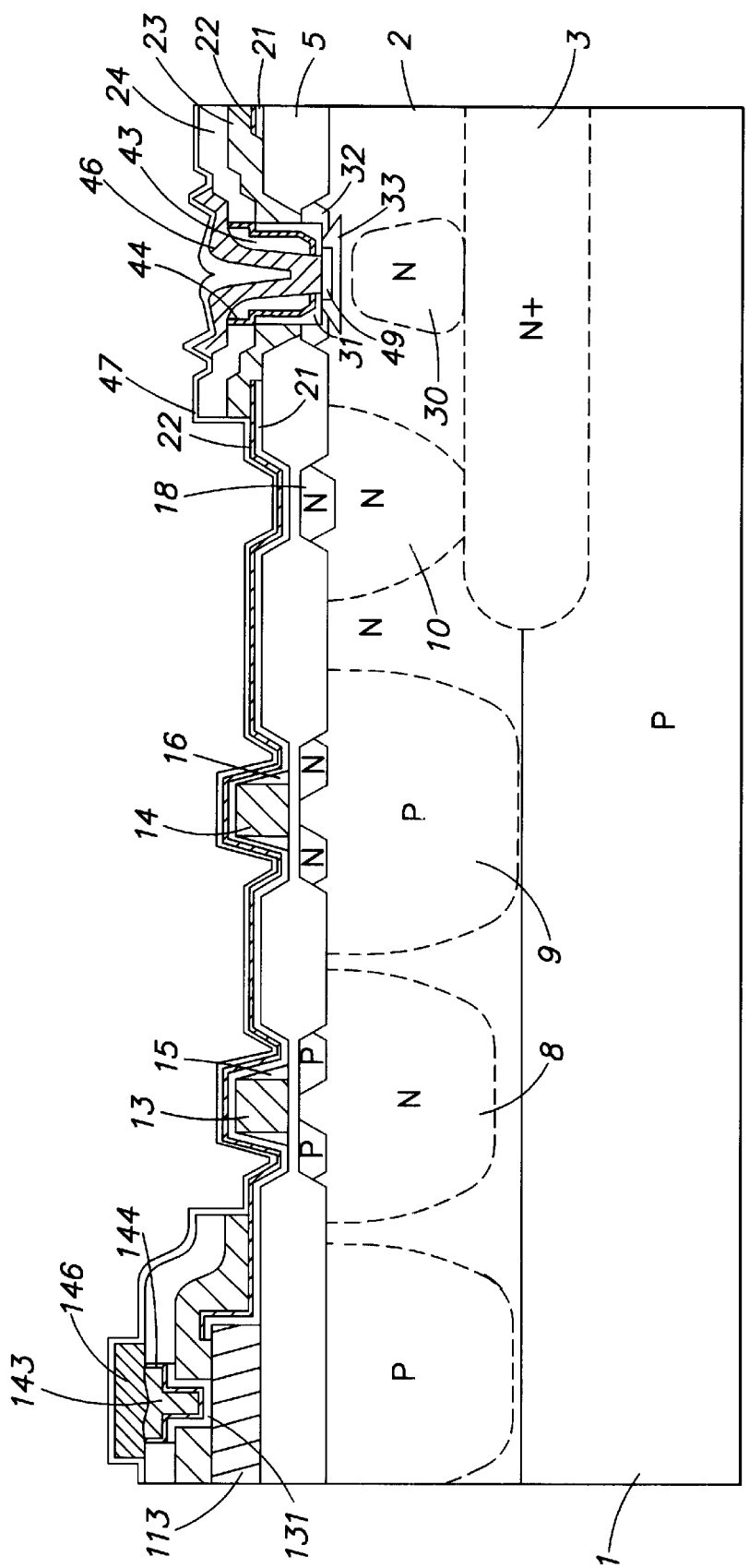

At the following step illustrated in FIG. 18, the N-type doped emitter polysilicon is etched to obtain a region 146 corresponding to region 46. Region 146 covers in particular region 143.

Thus, a capacitor having a first electrode corresponding to regions 143 and 146, formed of N$^+$-type polysilicon,; and having a second electrode corresponding to regions 113 and 123, formed of P$^+$-type polysilicon, is obtained. These electrodes are separated by a thin oxide layer 131, which has a thickness of about 5 to 10 nm, and by the silicon nitride layer 144 which has a thickness of about 30 nm.

The method is then continued without any specific step on the side of the capacitor region, besides, of course, the implementation of contacts to each of the electrodes.

Capacitors of very high capacitance per unit of surface area are thus obtained, given that the capacitor is implemented, on the one hand, by horizontally opposite electrodes and, on the other hand, by vertically and peripherally opposite electrodes, and due to the fact that nitride has a high dielectric constant with respect to oxide. The capacitance per surface area unit can be adjusted by choosing the thickness of oxide 131 and the thickness of nitride 144. This method only enables implementation of capacitors of very small dimensions since the polysilicon spacers have to completely fill up openings 101. This constitutes, in fact, an advantage since, in practice, a very large number of identical capacitors will be made side-by-side, and they will be able to be assembled in various ways to obtain general capacitors of identical values with a same perimeter/surface area ratio. Capacitor networks can also be formed.

It should again be stressed that the manufacturing of these capacitors requires no additional manufacturing steps with respect to the pre-existing steps of the previously described line of manufacturing. It will be enough to modify the outlook of the masks used in the different steps.

Those skilled in the art will notice that other components can be devised by using the line according to the present invention and that this line is likely to have many alterations, modifications and improvements. In particular, the several numerical values indicated have been given as an example only and each material indicated as an example may be replaced with another material performing the same function (for example, etching selectivity with respect to other materials). Further, various primary components can be implemented with or without a buried layer of one or the other type of conductivity.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated capacitor within an integrated semiconductor circuit, the capacitor comprising:
   a bottom electrode of a first conductivity type on a thick oxide region, the bottom electrode including:
      a bottom layer of silicon, and a second layer of polysilicon on top of the bottom layer, the second layer having an opening that extends to a top surface of the bottom layer;

a dielectric layer on top of the bottom electrode, conforming to the bottom and sides of the opening; and a top electrode of a second conductivity type on top of the dielectric, the top electrode including:

a third layer of polysilicon in the opening conforming to a surface of the dielectric layer, wherein the third layer is separated at the sides of the opening from the second layer by the dielectric, and separated at the bottom of the opening from the bottom layer by the dielectric layer; and a top layer of polysilicon on top of the third silicon layer.

2. The capacitor of claim 1, wherein the dielectric includes an oxide layer and a silicon nitride layer.

3. The capacitor of claim 2, wherein the integrated semiconductor circuit includes at least one MOS transistor and at least one bipolar transistor, and wherein the bottom polysilicon layer corresponds to a gate electrode of the at least one MOS transistor.

4. The capacitor of claim 3, wherein the second polysilicon layer corresponds to a base of the at least one bipolar transistor.

5. The capacitor of claim 4, wherein the third polysilicon layer corresponds to a spacer of the at least one bipolar transistor.

6. The capacitor of claim 3, wherein the top polysilicon layer corresponds to an emitter of the at least one bipolar transistor.

7. The capacitor of claim 2, wherein the opening has a maximum width of approximately 0.35 $\mu$m.

8. The capacitor of claim 7, wherein the oxide layer has a thickness of approximately 10 nm.

9. The capacitor of claim 8, wherein the silicon nitride layer has a thickness of approximately 30 nm.

10. The capacitor of claim 9, wherein the gate dimensions of any MOS components of the integrated circuit are less than 0.35 $\mu$m.

11. The capacitor of claim 2, wherein the bottom electrode is P-type doped and the top electrode is N-type doped.

12. The capacitor of claim 6, wherein the opening has a maximum width of approximately 0.35 $\mu$m.

13. The capacitor of claim 12, wherein the oxide layer has a thickness of approximately 10 $\mu$m.

14. The capacitor of claim 13, wherein the silicon nitride layer has a thickness of approximately 30 nm.

15. The capacitor of claim 14, wherein the gate dimensions of any MOS components of the integrated circuit are less than 0.35 $\mu$m.

* * * * *